United States Patent
Mizuno et al.

(10) Patent No.: US 7,497,908 B2
(45) Date of Patent: Mar. 3, 2009

(54) FILM COATING UNIT AND FILM COATING METHOD

(75) Inventors: Tsuyoshi Mizuno, Tokyo (JP); Yuuichi Mikata, Yokohama (JP); Kimihide Saito, Gunma (JP)

(73) Assignees: Sanyo Electric Co., Ltd (JP); Kabushiki Kaisha Toshiba (JP)

( * ) Notice: Subject to any disclaimer, the term of this patent is extended or adjusted under 35 U.S.C. 154(b) by 702 days.

(21) Appl. No.: 10/875,075

(22) Filed: Jun. 23, 2004

(65) Prior Publication Data
US 2004/0265493 A1 Dec. 30, 2004

(30) Foreign Application Priority Data
Jun. 23, 2003 (JP) ............................. 2003-178626

(51) Int. Cl.
*B05C 5/02* (2006.01)
(52) U.S. Cl. .................. 118/52; 118/319; 118/320; 118/321; 118/323
(58) Field of Classification Search ............... 118/52, 118/319, 320, 321, 323; 427/8, 335, 425, 427/427.2, 427.3
See application file for complete search history.

(56) References Cited

U.S. PATENT DOCUMENTS

| | | | | |
|---|---|---|---|---|
| 6,632,476 B2 * | 10/2003 | Nakamura et al. | ........... | 427/240 |
| 6,824,612 B2 * | 11/2004 | Stevens et al. | ................ | 118/52 |
| 2003/0165629 A1 * | 9/2003 | Sakurada | ................... | 427/421 |

\* cited by examiner

*Primary Examiner*—Laura Edwards
(74) *Attorney, Agent, or Firm*—Andrus, Sceales, Starke & Sawall, LLP

(57) ABSTRACT

Film coating unit has a substrate holder for holding a wafer, a coating solution discharge nozzle, and anti-drying boards opposed to a surface of the wafer. The coating solution is applied to the surface of the wafer in a direction from a front end toward a rear end of the wafer while relatively moving the substrate holder with respect to the coating solution discharge nozzle. During that time, the anti-drying boards are disposed at height of maximum 2 mm from the surface of the wafer so as to form dense atmosphere of a solvent between the surface of the wafer and the anti-drying board. Thereby the coating solution on or over the surface of the wafer is restrained from being dried and a coating film is formed with even thickness on or over the surface of the wafer.

13 Claims, 13 Drawing Sheets

PRIOR ART

FILM COATING UNIT AND FILM COATING METHOD

BACKGROUND OF THE INVENTION

1. Field of the Invention

The present invention relates to a film coating unit and film coating method to form, for example, interlayer insulation film, insulation film as overcoat for device, and so on by applying predetermined coating liquid to a surface of a substrate such as a semiconductor wafer.

2. Description of the Related Art

As one of the semi-conductor manufacturing process, in order to form insulation film such as interlayer insulation film, for example, such technique is known that liquid film is prepared by applying coating solution on a surface of a substrate such as a semiconductor wafer wherein precursor material of silicon oxide film is dissolved in solvent and the solvent is vaporized from this liquid film to form the insulation film which is coating film comprising silicon oxide film.

As one of techniques for applying the coating solution on the surface of a substrate, such technique is known as to apply the coating solution in a manner of so-called drawing with one stroke drawing (for example, refer to Patent Document 1 and Patent Document 2).

With respect to coating techniques in a manner of this drawing with one stroke drawing, one example, will be briefly described taking a semiconductor wafer (herein after referred to as a wafer) as a substrate to be processed. As shown in FIG. 13, here, a wafer W is held on a substrate holder and a coating solution discharge nozzle 10 is disposed opposite to a surface of the wafer W. A small-diameter discharge orifice of the coating solution discharge nozzle 10 supplies coating solution 11 on the surface of the wafer W. The coating solution discharge nozzle 10 reciprocates in an X-direction and the wafer W is intermittently moved in a Y-direction while supplying the coating solution 11. In this case, it is desirable to cover by masking 12 a part aside from an area where circuit is formed on the wafer W to prevent that coating solution attaches to a rim and a back side of the wafer W. According to this technique, a coating film may be formed without wasting the coating solution as the wafer W is not rotated, for example, so as in a spin coating method. And, specifically, this coating method is preferable in case of coating a large sized substrate.

[Patent document 1] JP, A, No. 2002-353132

[Patent document 2] JP, B, 33-10788

However, in the above coating technique, it takes considerable time for the coating solution discharge nozzle 10 to move along a coating course from a front end to a terminal end of the wafer W to apply the coating solution entirely to the surface of the wafer W. So, solvent evaporates first from a part to which the coating solution is applied ahead, and the coating solution applied dries out or dehydrates. And due to evaporation of the solvent, surface tension of the coating solution applied is increased. Therefore, a problem that the coating solution which is applied later is pulled or drawn by the coating solution which is applied ahead, resulting that film thickness of the part to which the coating solution is applied ahead is enlarged.

One of counter measures to solve this problem is disclosed by Patent Document 1. Here, a top board (cover) is provided at predetermined height so as to cover a surface of the wafer W to control drying state of the coating solution. However, coating solution must be selected according to planned type of film. If coating solution of low viscosity, for example, to be selected for interlayer insulating film is processed in the same condition as in other coating solution of other high viscosity, drying state of the coating solution is not controlled sufficiently in some case. Thus, another coating unit should be considered.

And, Patent Document 2 discloses technique to control drying speed of a coating solution or a coating film by means of supplying solvent vapor thereto. According to the disclosure, a top board, which is disposed opposite to a surface of the wafer W, is provided with a plurality of perforations in a surface of the top board, and solvent vapor is supplied via the perforations to the coating solution or the coating film. However, if the solvent vapor or steam is sprayed via the perforations to the coating solution or the coating film on the surface of the wafer W, there is a concern that the air current disturbs surface of the coating solution or the coating film on the wafer W, resulting in uneven thickness of the coating solution or the coating film thereon.

The present invention was made based on such circumstances. It is an object of the present invention to provide a novel film coating unit and a novel film coating method to form an even coating film such as insulation film on or over a surface of a substrate by controlling drying state of the coating solution which is applied to the surface of the substrate in a direction from a front end toward a rear end thereof, for example, in a manner of so-called drawing with one stroke.

SUMMARY OF THE INVENTION

A film coating unit according to the present invention for forming a coating film on a surface of a substrate, may comprise a substrate holder for holding the substrate horizontally, a coating solution discharge nozzle for applying coating solution to the surface of the substrate held by the substrate holder in a direction from a front edge toward a rear edge of the substrate or from a front edge toward a rear edge of the substrate, a driving section for relatively moving the substrate holder in a forward and backward direction with respect to the coating solution discharge nozzle, and an anti-drying board opposed to the surface of the substrate in parallel relation thereto, at height of maximum 2 mm, namely, 2 mm or less from the surface thereof. The anti-drying board is disposed so as to cover an entire range of the surface of the substrate to which the coating solution is applied by the coating solution discharge nozzle.

Further, a film coating unit according to the present invention for forming a coating film on a surface of a substrate may comprise a substrate holder for holding the substrate horizontally, a coating solution discharge nozzle for applying coating solution to the surface of the substrate held by the substrate holder, in a direction from a front edge toward a rear edge of the substrate or from a front edge toward a rear edge of the substrate, a driving section for relatively moving the substrate holder in a forward and backward direction with respect to the coating solution discharge nozzle and an anti-drying board opposed to the surface of the substrate so as to cover an entire range of the surface of the substrate to which the coating solution is applied by the coating solution discharge nozzle and having a number of supply perforations for providing solvent vapor below the anti-drying board. Here, a solvent absorber is provided on the anti-drying board, and a solvent supply section supplies the solvent to the solvent absorber. The solvent absorber may be, for example, sponge member.

Also, the film coating unit may include a first driving section for relatively moving intermittently the substrate holder with respect to the coating solution discharge nozzle so that the coating solution discharge nozzle relatively moves in a direction from a front edge toward a rear edge of the substrate or from a front edge toward a rear edge of the substrate, and a second driving section for moving the coating solution discharge nozzle right and leftward so as to apply the coating solution in linear shape on the surface of the substrate. And, the first driving section and the second driving section move the coating solution discharge nozzle or the coating solution discharge nozzle and the substrate holder so as to form linear coating patterns sequentially in rows toward a rear side of the substrate.

The coating solution may have viscosity of maximum 5 cp, namely 5 cp or less at least when the coating solution is applied to the surface of the substrate. And, a peripheral edge portion of the anti-drying board may be folded downward in the outside of the substrate. The film coating unit may further comprise a height adjustment mechanism for adjusting a relative height of the anti-drying board with respect to the substrate. The film coating unit may yet further comprise a memory for storing data which relate a kind of the coating solution to the relative height of the anti-drying board with respect to the substrate, and a controller for adjusting the relative height of the anti-drying board with respect to the substrate, depending on a kind of a selected coating solution, for example, with reference to the data.

A film coating method according to the present invention for forming a coating film on a surface of a substrate comprises steps of applying a coating solution to a surface of the substrate by coating solution discharge nozzle in a direction from a front edge toward a rear edge of the substrate or from a front edge toward a rear edge of the substrate, and covering a range of the surface of the substrate to which the coating solution is applied, by an anti-drying board opposed to the surface of the substrate in parallel relation thereto, at height of maximum 2 mm therefrom, while applying the coating solution. Another film coating method according to the present invention for forming a coating film on a surface of a substrate comprises steps of applying a coating solution to a surface of the substrate by coating solution discharge nozzle in a direction from a front edge toward a rear edge of the substrate or from a front edge toward a rear edge of the substrate, covering a range of the surface of the substrate to which the coating solution is applied, by an anti-drying board having a number of supply perforations while applying the coating solution, and supplying solvent vapor evaporated from the solvent absorber provided on the anti-drying board via a number of the supplying perforations below the anti-drying board, while applying the coating solution.

EFFECTS OF THE INVENTION

According to the present invention, when a coating solution is applied to a surface of a substrate for coating film such as insulation film in a direction from a front edge toward a rear edge of the substrate or from a front edge toward a rear edge of the substrate, for example, in a manner of so-called drawing with one stroke, the anti-drying board is disposed opposite to a surface of the substrate with a gap of maximum 2 mm defined between a surface of the anti-drying board and the surface of the substrate. Accordingly, as thick or dense atmosphere of the solvent vapor is formed in the gap and drying speed of a coating solution which is applied to the surface of the substrate ahead is controlled, coating film, namely insulation film may be formed evenly or uniformly in film thickness on or over the surface of the substrate.

According to the another aspect of the present invention, the anti-drying board is provided with a solvent absorber thereon and solvent vapor evaporated from the solvent absorber in which the solvent is soaked is supplied in the gap between the surface of the anti-drying board and the surface of the substrate. Accordingly, as evaporating speed of a coating solution which is applied to the surface of the substrate ahead is thereby controlled, coating film, such as insulation film may be formed evenly or uniformly in film thickness on or over the surface of the substrate.

DETAILED DESCRIPTION OF THE PREFERRED EMBODIMENTS

Now, the preferred embodiments of the present invention will be described in detail with reference to the drawings.

Figure 1:
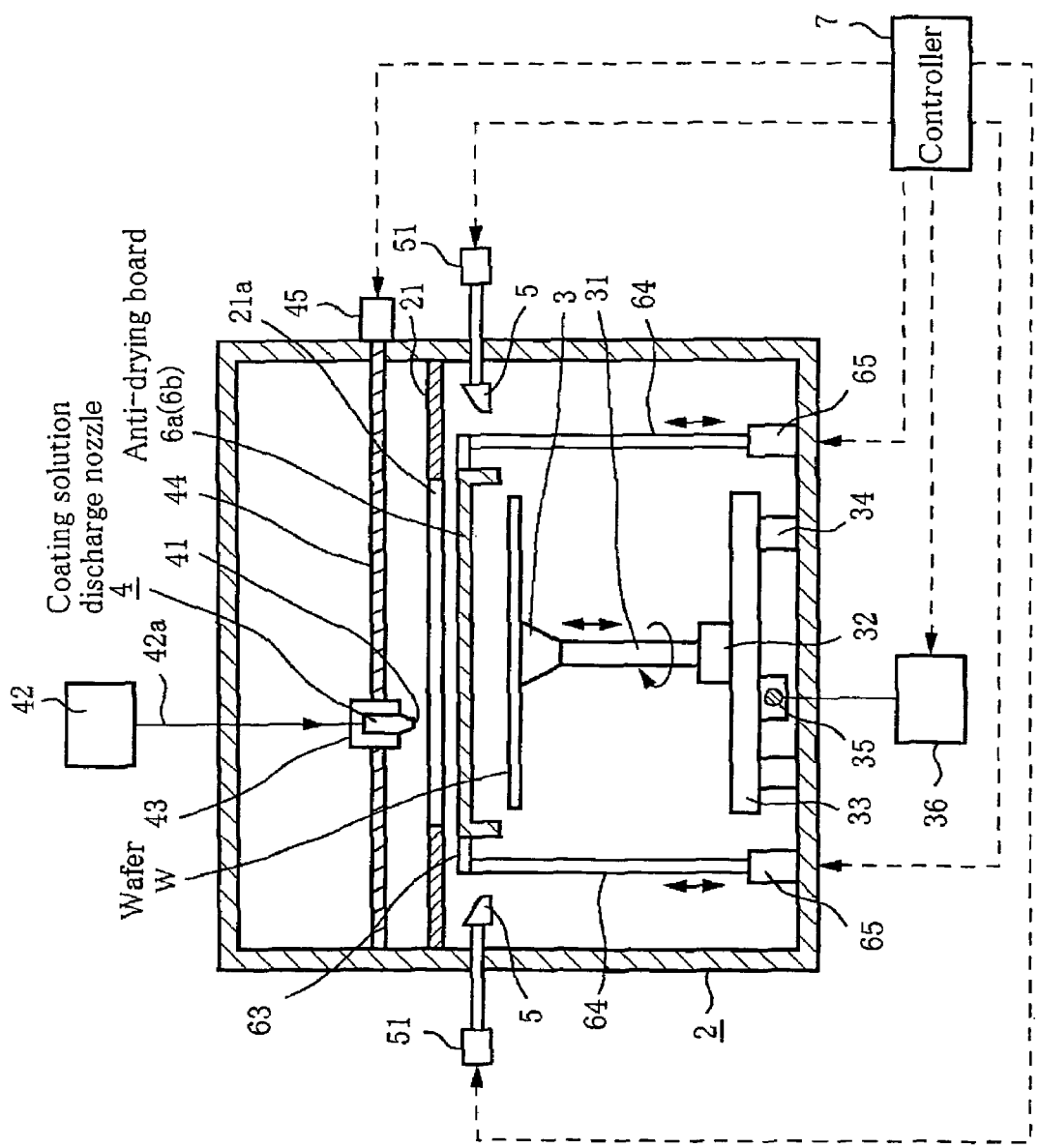
FIG. 1 is longitudinal sectional view of a film coating unit according to an embodiment of the present invention.
Figure 2:
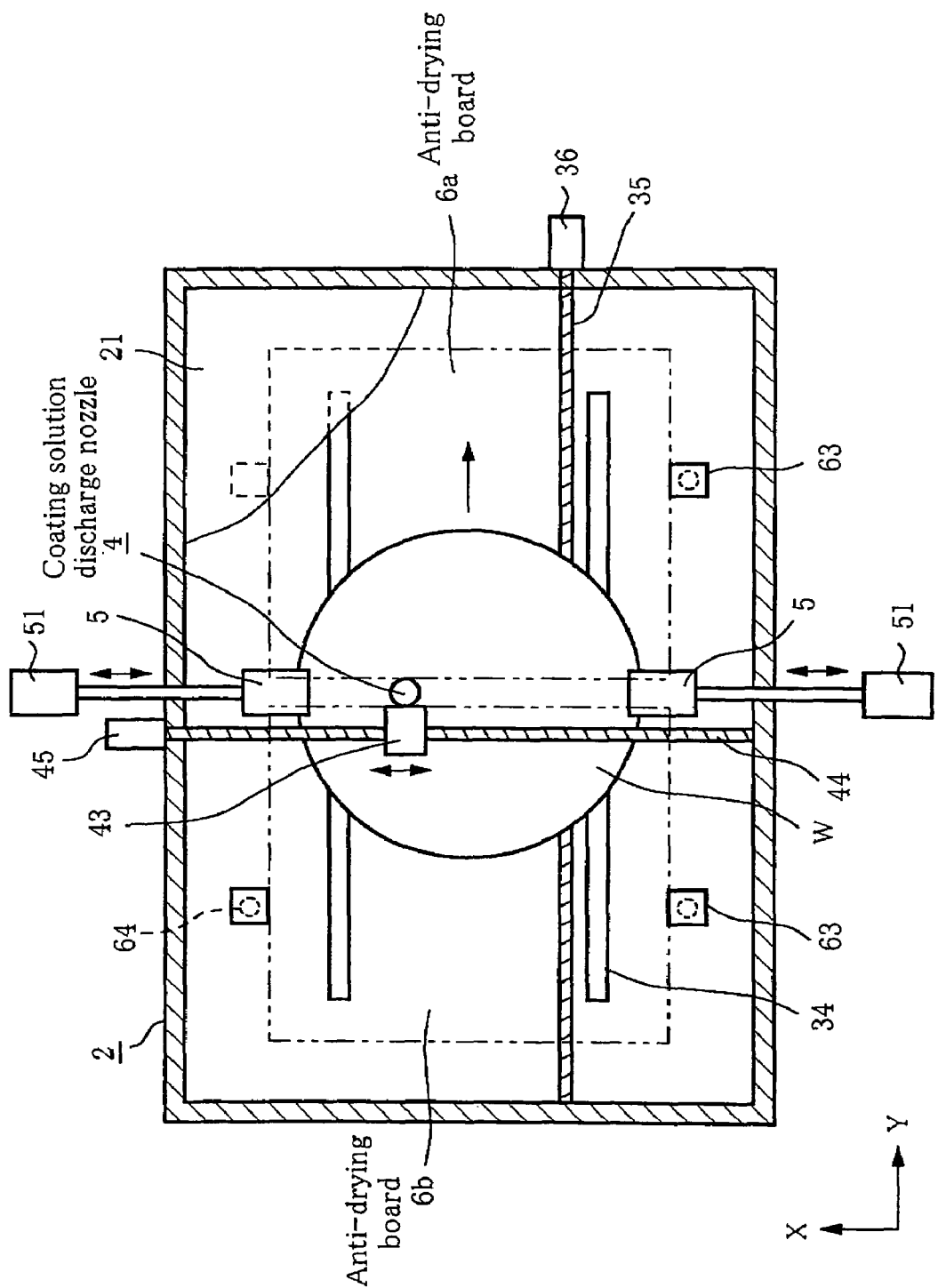
FIG. 2 is a plan view of the film coating unit.

As shown in FIGS. 1 and 2, reference numeral 2 indicates a casing which defines a housing, and an interior space of the casing 2 is divided into upper and lower parts by a partition board 21. The partition board 21 is formed with a slit 21a on a center part thereof extending in a X-direction. And, in the lower part, namely lower space under the partition board 21, there is provided a substrate holder 3 for holding a substrate to be processed, for example, a wafer W generally horizontally by sucking and holding it on a back surface side thereof. The substrate holder 3 is configured to go up and down or be rotatable about a vertical axis while holding the wafer W thereon by a holder moving mechanism 32 which is connected to the substrate holder 3 via a shaft 31. The holder moving mechanism 32 is supported by a moving base 33.

In addition, the casing 2 is provided on a bottom surface thereof with two guide rails 34, 34 extending in a Y-direction, for example, which is a longitudinal direction of the casing 2. The moving base 33 is supported by the guide rails 34, 34 on upper surfaces of the guide rails 34, 34. And, a ball screw 35 is disposed along the guide rails 34, 34. The moving base 33 is engaged threadedly with this ball screw 35. The substrate holder 3 is constructed to be movable with the wafer W thereon in a longitudinal direction (a Y-direction), for example, at speed of 1000 mm/sec, along with the moving base 33 by rotating the ball screw 35 with the driver 36, for example, a motor which is disposed, for example, outside the casing 2. Namely, the first driving section has the moving base 33, the guide rails 34, 34, the ball screw 35 and the driver 36. In addition, inside the casing 2, for example, downflow of clean air is secured by clean air feed means (not shown).

In the upper part, namely an upper space above the partition board 21, a coating solution discharge nozzle 4 is provided opposite to a surface of the wafer W on the substrate holder 3. This coating solution discharge nozzle 4 has discharge outlet 41 of small diameter, for example, of 50 μm on a lower side thereof. The coating solution discharge nozzle 4 is configured so as to supply a coating solution for insulation film, which is delivered via a flow path 42a from a supply source 42, for example, provided outside the casing 2, to the surface of the wafer W via the discharge outlet 41. The coating solution may be created by dissolving in a solvent a solid solute (siloxane polymer) which is, for example, precursor to silicon oxide film. And, quantity of the solvent is adjusted in the coating solution so that the coating solution has viscosity of maximum 10 cp (centi-poise), preferably maximum 5 cp at predetermined processing temperature, for example, 25° C., for example, at least when applied to the surface of the wafer W. In addition, nozzle-side ball screw 44, which is engaged threadedly with nozzle holder member 43 holding the coating solution discharge nozzle 4, is disposed so as to extend generally perpendicular to the guide rails 34, 34 in a X-direction. A guide rod (not shown) is disposed through the nozzle holder member 43 in parallel with the nozzle-side ball screw 44, and the coating solution discharge nozzle 4 is configured to be able to reciprocate in a transverse direction (right and leftward), for example, at speed of 1000 mm/sec, unitedly with the nozzle holder member 43 by rotating the nozzle-side ball screw 44 with the nozzle driver 45, for example, a motor which is disposed, for example, outside of the casing 2. Namely, the second driving section has the nozzle holder member 43, the guide-rod (not shown), and the nozzle-side ball screw 44.

In addition, a pair of liquid receiving means or solution receiving means 5, 5 are provided at a position slightly higher than a surface of the wafer W held by the substrate holder 3. The solution receiving means 5, 5 receive coating solution oriented to a position on an extension in a moving direction of the coating solution discharge nozzle 4, and corresponding to a peripheral edge of the wafer W in order to prevent the coating solution from being supplied outside a region on the wafer W where a circuit is to be formed. Each of the solution receiving means 5, 5 is shaped, for example, of tray so as to receive and collect the coating solution falling down or dropping from above. Further, although not shown, there is provided a cleaning mechanism for washing away the coating solution attached on a surface of the solution receiving means 5 and an exhaust passage for exhausting the coating solution collected in the solution receiving means 5. And, the solution receiving means 5 is configured to be movable back and forward in a X-direction by a back and forward driving section 51 so as to allow an inner end thereof to be located on a position corresponding to an outer edge of the region on the wafer W where a circuit is to be formed.

Figure 3:
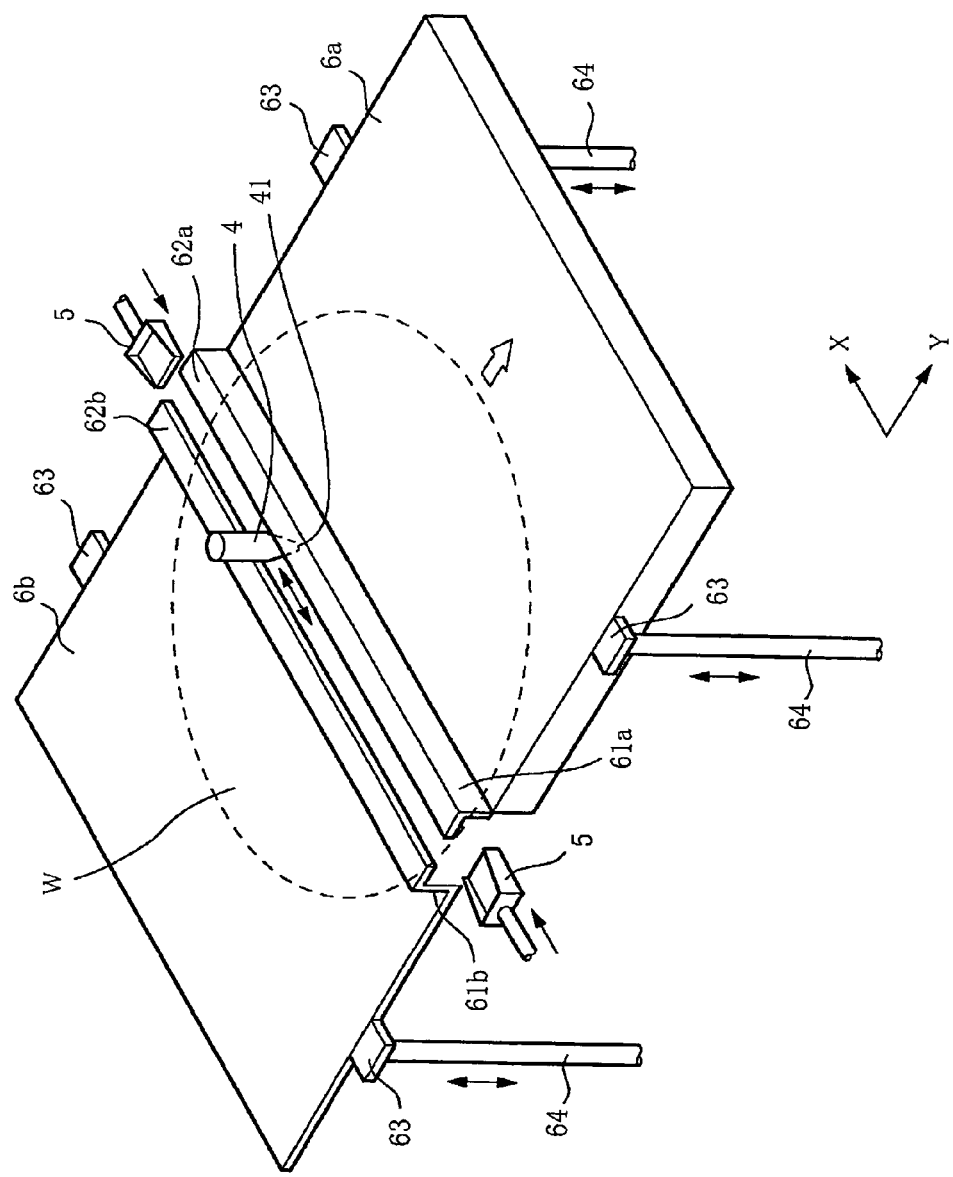
FIG. 3 is a perspective view of an anti-drying board of the film coating unit.

Furthermore, two anti-drying boards 6a, 6b are provided in side by side relation with one another in a longitudinal direction of the casing 2, opposed to the surface of the wafer W on the substrate holder 3, in parallel relation thereto. Each of the anti-drying boards 6a, 6b is a flat plate shaped of square, for example, larger than the wafer W, for example with thickness of 1.0 mm. The anti-drying boards 6a, 6b are explained in detail with reference to FIG. 3. In one anti-drying board, which is located on a side of a moving or travelling direction of the wafer W during coating process, of two anti-drying boards 6a and 6b, namely the anti-drying board 6a, a peripheral edge except for one side edge opposite to the anti-drying board 6b is folded downward so as to extend below a level of the surface of the wafer W, for example, for 5.0 mm. This construction brings about such merit that vapor component from the coating solution applied to the wafer W may be trapped in a gap defined between the wafer W and the anti-drying board 6a. The anti-drying boards 6a, 6b are provided with upright walls 61a and 61b along one side edges thereof opposed with one another. The upright walls 61a and 61b have planer bodies 62a, 62b which extend outwardly, on upper edges (upper edge surfaces) of the upright walls 61a and 61b. And, between the planer bodies 62a, 62b there is defined a clearance extending in a X-direction. The coating solution discharge nozzle 4 is configured to scan in the clearance or moving along the clearance. And an area surrounded by the upright walls 61a, 61b and the planer bodies 62a, 62b is configured as passageway or moving area for the solution receiving means 5, 5.

The anti-drying boards 6a, 6b are further provided with support members 63 on side edges extending in a Y-direction. The support members 63 are connected via shafts 64 respectively to a board elevating mechanism 65 as board level adjustment mechanism which is provided in a bottom surface of the casing 2. So, each of the anti-drying boards 6a, 6b are configured to be able to go up and down independently. And the anti-drying boards 6a, 6b are disposed at height, for example, of maximum 2 mm from the surface of the wafer W, namely define a vertical gap, for example, of maximum 2 mm between surfaces thereof and the surface of the wafer W. A vertical distance of the gap within a range up to 2 mm is determined on various factors, for example, depending on kind or type of the coating solution. Specifically, the vertical distance of the gap is preferably determined, for example, so as to correspond to viscosity of the coating solution. Meanwhile, as the coating solution is built up on the surface of the wafer W, for example, even if the vertical distance of the gap is designed 2 mm, an actual vertical distance is slightly smaller than 2 mm. However, thickness of builtup coating solution is, for example, approximately 20 μm, and quite small with respect to the gap. And, it is desirable that the anti-drying board 6a, 6b are formed from material of low thermal-conductivity, for example, PP (polypropylene), fluorinated resin or fluorocarbon type resin in order to prevent a drying state of the coating solution on the wafer W is affected as temperature of a surface of the wafer W becomes non-uniform or uneven during coating process.

Figure 4:
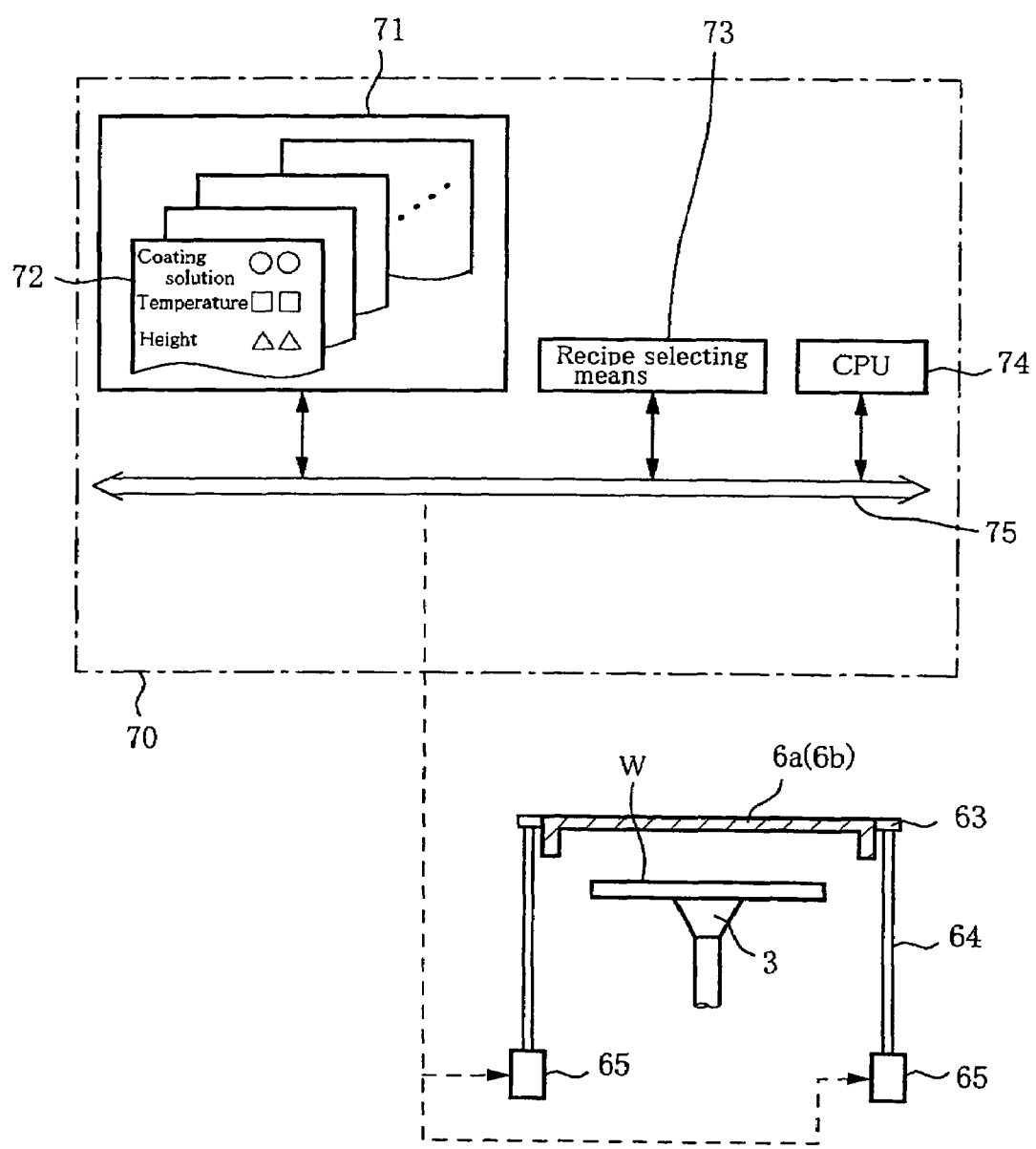
FIG. 4 is an explanatory view showing a control means of the film coating unit.

Now return to FIG. 1, reference numeral 7 indicates a controller. The controller 7 has functions for controlling actuation of the holder elevating mechanism 32, the driver 36, the nozzle driver 45, the back and forward driving section 51 and the board elevating mechanism 65. The controller 7 is further described herein below with respect to its own control functions with reference to FIG. 4. The controller 7 has a computer 70. The computer 70 includes a memory as a memory section 71 where a plurality of process recipes 72 are stored. In these process recipes 72, there is stored information of processing conditions according to a kind (or type) of the coating solution, for example, temperature of the wafer W, temperature of the coating solution, height location of the anti-drying boards 6a, 6b which are set according to a kind of the coating solution. That is to say, viscosity of the coating solution is determined by type of the coating solution. So, in this example, the process recipes 72 contain information of set value of height location of the anti-drying boards 6a, 6b corresponding to viscosity of the coating solution. Reference numeral 73 in FIG. 4 indicates recipe selecting means. A suitable or predetermined process recipe 72 is selected based on a kind or type of the coating solution, for example, manually by an operator. According to information in the process recipe 72 selected, the board elevating mechanism 65 for raising and lowering the anti-drying boards 6a, 6b is controlled, and thereby the anti-drying boards 6a, 6b are located at a suitable or predetermined height. In FIG. 4, reference numeral 74 indicates CPU, and reference numeral 75 indicates bus.

In addition, the process recipe 72 may contain information of moving or travelling speed of the substrate holder 3 to be determined corresponding to a kind or type of the coating solution. In this case, set values of height level of the anti-drying boards 6a, 6b and moving speed of the substrate holder 3 are to be determined in correspondence with viscosity of the coating solution. This configuration is advantageous as this allows to restrain affection of shear stress by air current generated when the substrate holder 3 moves intermittently while applying the coating solution. Here, if moving speed of the substrate holder 3 is too fast, affection of the shear stress becomes strong. On the contrary, if moving speed is too slow, not only evaporation of a solvent progresses before the substrate holder 3 enters under the anti-drying board 6a, but also the coating solution is excessively wasted by just that much as the coating solution discharge nozzle 4 is in standby state above the solution receiving means 5. Thus, preferably, moving speed of the substrate holder 3 is determined by conducting experiments in advance. As for one example of the above, moving speed is set for 1000 mm/second.

Then, technique to form insulation film on a surface of a substrate to be processed, for example, the wafer W by means of the above film coating unit. First, the substrate holder 3 is set on a rear position, namely under the anti-drying board 6b, at lower level. A wafer W, for example, for which necessary pretreatment is implemented, is delivered in the casing 2 through a gateway (not shown) formed on a side surface of the casing 2, while the anti-drying boards 6a, 6b are located at upper level and the solution receiving means 5, 5 is in open state. And, the wafer W is sucked and held on the substrate holder 3. Subsequently, the substrate holder 3 is raised to a height so as to define a slight gap between a bottom surface of the solution receiving means 5 and a surface of the wafer W. And the anti-drying boards 6a, 6b are lowered to a predetermined height, for example, based on information of the process recipe 72 which is selected by an operator. Then, the substrate holder 3 is moved or traveled in a longitudinal direction (Y-direction) while holding the wafer W thereon, so that one end (a front end) of the wafer W is guided to a coating start position, and at the same time, the coating solution discharge nozzle 4 is guided above the one end of the wafer W (coating start position). And, the solution receiving means 5 is set to be closed up to a predetermined position, and to overlying a part outside a region of the wafer W where circuit is formed.

Figure 5:
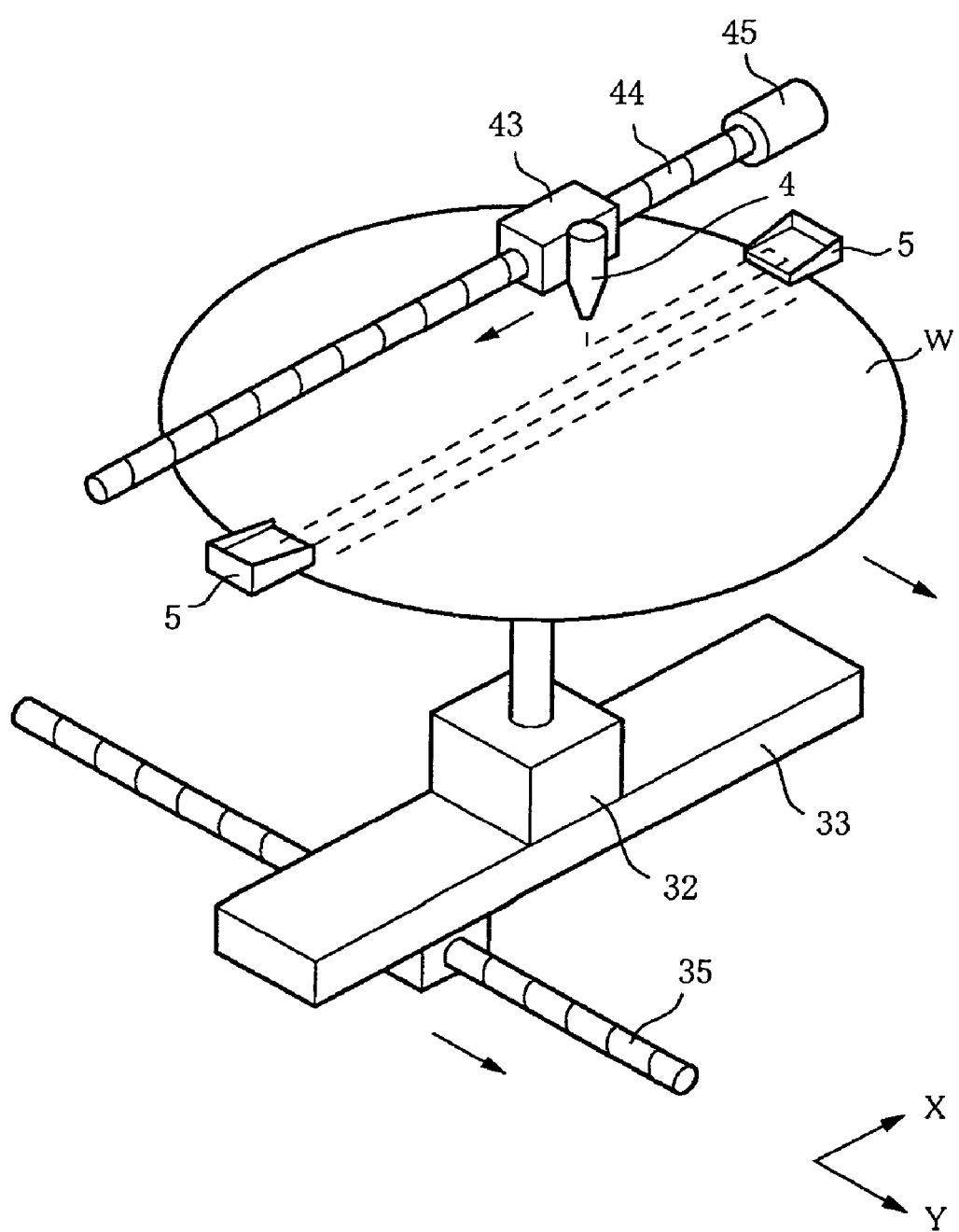
FIG. 5 is an explanatory view showing processing a substrate by applying a coating solution to a surface of the substrate with the film coating unit.
Figure 6:
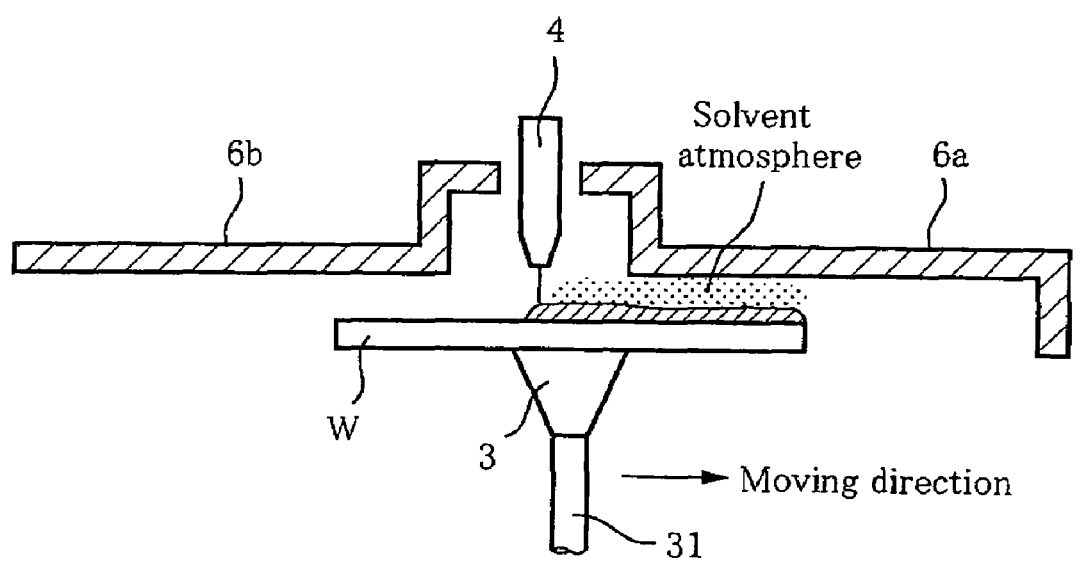
FIG. 6 is another explanatory view showing processing a substrate by applying a coating solution to a surface of the substrate with the film coating unit.

Next, as shown in FIG. 5 (for convenience of explanation, the anti-drying boards 6a, 6b are omitted), the coating solution discharge nozzle 4 is scanned or moved in one direction of right and leftward (in a X-direction) while discharging the coating solution onto the surface of the wafer W. When the coating solution is completely built up on the surface of the wafer W in one linear pattern, the substrate holder 3 moves intermittently forward so that the wafer W enters or further advances under the anti-drying board 6a. Thus such cycle is repeated, that is to say, the coating solution discharge nozzle 4 reciprocates right and leftward, starting from one peripheral edge of the wafer W, over a center line, toward a diametrically opposite peripheral edge of the wafer W with discharging the coating solution, while the wafer W moves intermittently forward. Thereby, the coating solution is applied to the surface of the wafer W in a direction from a front edge to a rear edge thereof or from a front edge to a rear edge thereof in a manner of so-called drawing with one stroke. To be exact, as the coating solution to be oriented to the peripheral edge of the wafer W is received in the solution receiving means 5, 5, linear patterns of the coating solution are to be arranged in rows, for example, without clearance backwards and forwards in a range of the wafer W where circuit is formed. Here, as shown in FIG. 6, a solvent component or ingredient evaporated from the coating solution on the surface of the wafer W which enters under the anti-drying board 6a, is filled in the slight gap between the wafer W and the anti-drying board 6a, and a thick or dense atmosphere containing the solvent component, for example, an atmosphere including near maximum vapor tension or pressure of saturated vapor of the solvent is formed near the surface of the wafer W, and thereby drying speed of the coating solution applied may be restrained.

According to the above-described embodiment, in case that the coating solution for insulation film is applied on the surface of the wafer W, in a direction from a front edge to a rear edge thereof or from a front edge to a rear edge thereof, for example in a manner of so-called drawing with one-stroke, evaporation speed of the solvent from the coating solution applied may be controlled by setting a vertical gap of maximum 2 mm between the surface of the wafer W and the surfaces of the anti-drying boards 6a, 6b. As a result, drying speed of the coating solution on the surface of the wafer W slows down as a whole, and this minimizes difference between prior coated portion (the portion to which the coating solution is applied ahead) and later coated portion (the portion to which the coating solution is applied later) with respect to drying state (progress of drying). Consequently, a insulation film as coating film is formed evenly or uniformly with respect to film thickness on or over the surface of the wafer W.

The inventors assumed the reason that film thickness profile is improved as follows. As the solid solute or component of the coating solution for insulation film is composed mainly of an inorganic ingredient or component of low-molecular weight, the coating solution often has low viscosity of maximum 10 cp, or 10 cp or less. In case of applying a coating solution in a scan coating method or a scan manner, there is a time lag with respect to coating between the coating solution applied on a coating start side and that applied on a coating end side of the wafer W. As drying or dehydration progresses earlier on the coating solution applied on the coating start side, a concentration gradient is generated on the surface of the wafer W, and a flow is generated in the coating solution on the wafer W. That is to say, the coating solution applied on the coating start side has high density and high viscosity due to vaporization of solvent. On the other hand, the coating solution applied on the coating end side has relatively low density and low viscosity, and flows to a side where the coating solution has higher density. Then, solid solute in the coating solution is carried to the coating start side, and thereby the coating solution on the coating start side becomes thick. In the coating solution for insulation film, by approaching the anti-drying board 6a to the surface of the wafer W and drying speed of the coating solution applied ahead is positively restrained, it is possible to realize highly accurate film thickness profile. Therefore, in the coating solution of low viscosity such as that for insulation film, if a vertical gap over 2 mm between the anti-drying board 6a and the wafer W is defined at least before the coating solution is completely applied to an entire surface of the wafer W, as apparent from an embodiment to be described later, the concentration gradient is generated in the coating solution applied thereto resulting in deteriorate film thickness profile.

If the anti-drying board 6a is located to define a vertical gap of maximum 2 mm with respect to a surface of the wafer W, a shearing stress or shearing force is generated when the wafer W is moved or by movement of the wafer W. Presumably, the coating solution or film on the wafer W is drawn toward the coating end side due to affect of the shearing force. However, as a result, the coating solution or film on the coating end side never thereby becomes thick. That means, thickness of the coating solution or film is affected more by the solid solute carried due to the concentration gradient than by the shearing stress or shearing force. Furthermore, the coating solution for insulation film has low viscosity, therefore, high fluidity. So, even if the coating solution is subject to the shearing stress or shearing force due to air current, the coating solution may return to its original condition in stationary state or when coating operation stops. However, after the coating solution is completely applied entirely to the wafer W and the anti-drying board 6a once lies over the entire surface of the wafer W, the anti-drying board 6a may be raised, for example, so as to define a vertical gap over 5 mm to accelerate or promote evaporation of the solvent.

Figure 7:
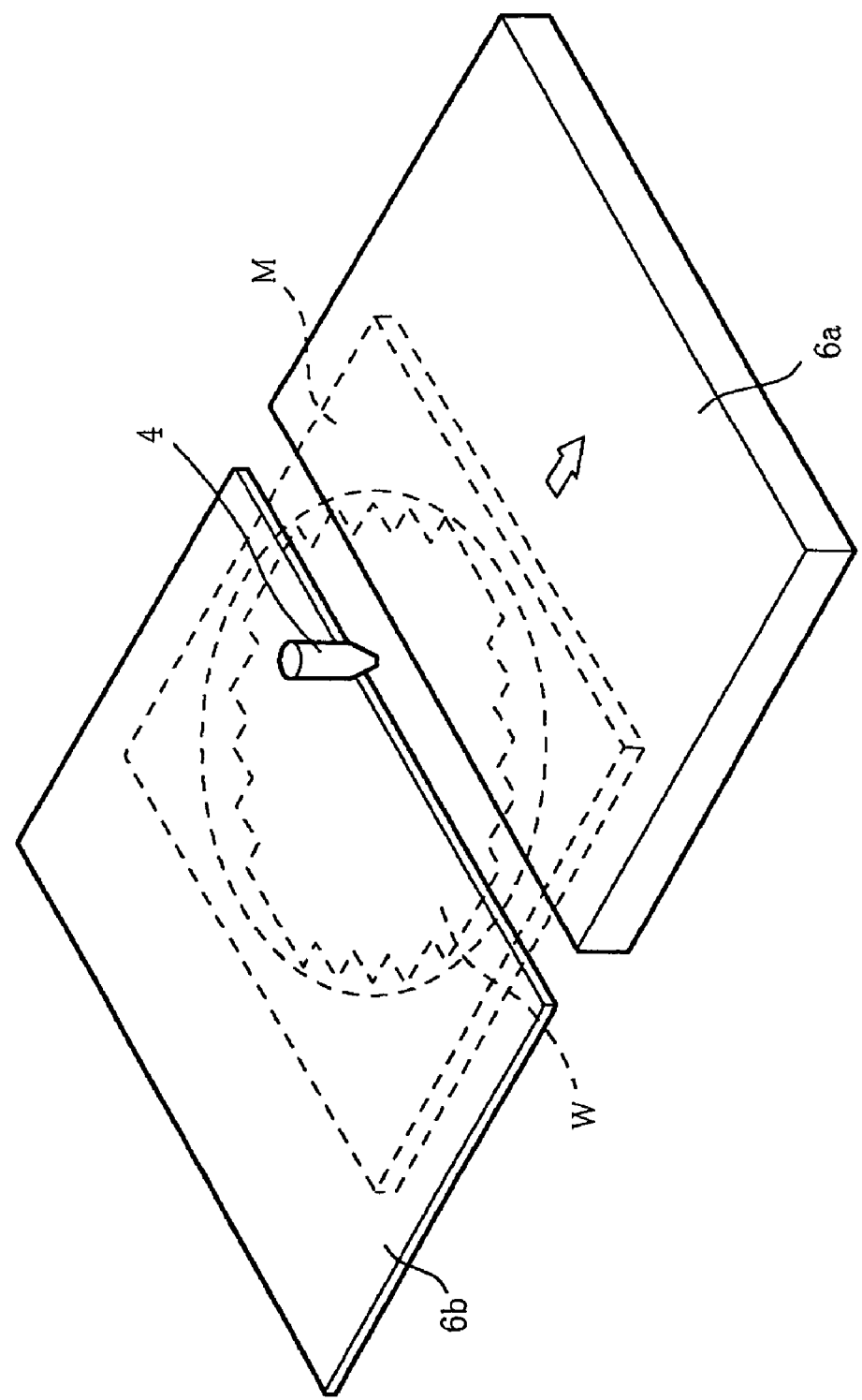
FIG. 7 is an explanatory view of another example of the anti-drying board with regard to the present invention.

The above embodiment may be configured without including the solution receiving means 5 for preventing the coating solution from being applied to outside the region to which circuit is formed (outside the region to be coated). For example, as shown in FIG. 7, a masking M may be provided so as to cover a peripheral edge of the wafer W. In this case, the anti-drying boards 6a, 6b may be constructed without having the upright walls 61a, 61b and the planar bodies 62a, 62b. And, such construction also provides the same effects as described above. And, the film coating unit may be configured such that the anti-drying boards 6a, 6b are fixedly secured, and the substrate holder 3 for holding the wafer W is movable up and down (or ascendable and descendable).

Figure 8:
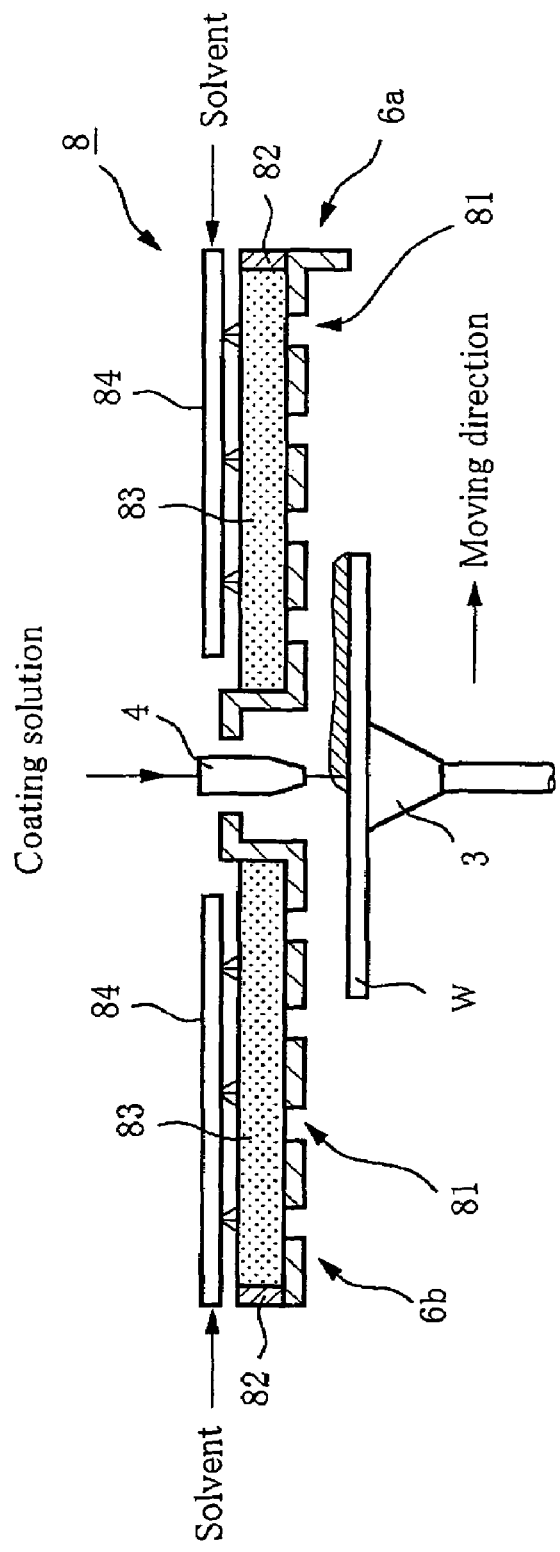
FIG. 8 is an explanatory view showing a film coating unit according to another preferred embodiment of the present invention.
Figure 9:
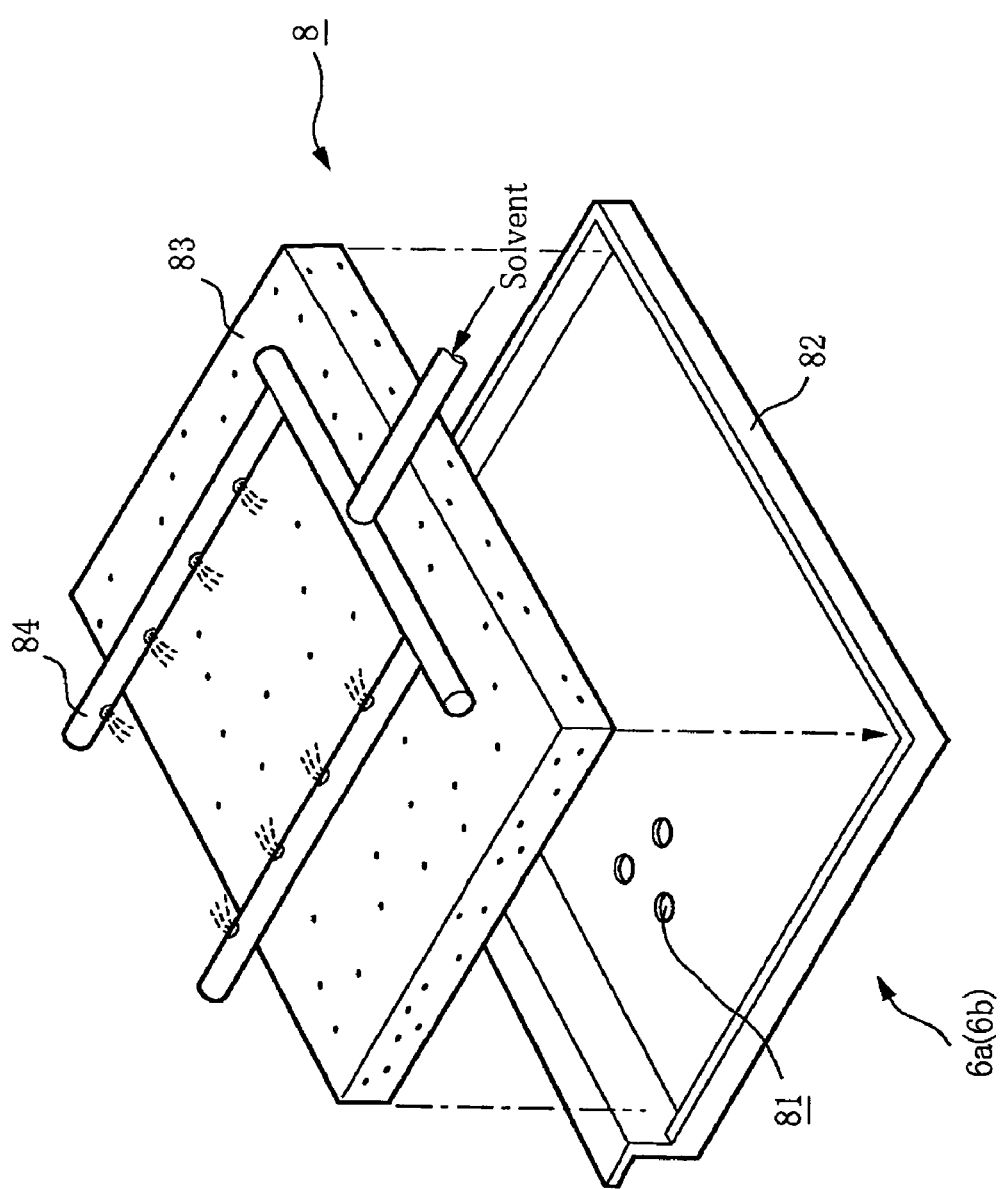
FIG. 9 is another explanatory view showing the film coating unit according to the another preferred embodiment of the present invention.

Then, another embodiment according to the present invention is explained. In the another embodiment, another film coating unit includes a solvent vapor supply means or solvent steam supply means for supplying solvent vapor or steam in a gap between the wafer W and the anti-drying boards 6a, 6b in order to control evaporation speed of the coating solution. As for other configurations, the another film coating unit is substantially the same as the film coating unit as shown in FIGS. 1 and 2. In the solvent vapor supply means 8, as shown in FIGS. 8 and 9, the anti-drying boards 6a, 6b are formed with a number of supply perforations 81 which are through holes for supplying the solvent vapor down below therethrough, for example, on the surface of the anti-drying boards 6a, 6b, standing walls 82, 82 for surrounding peripheral edges on upper surface thereof and porous sponge members 83, 83 as solvent absorber surrounded by the standing walls 82, 82 respectively. A liquid solvent, for example, a solvent containing solvent ingredient in the coating solution to be applied to the surface of the wafer W, is supplied from different or separate source and soaked in the sponge members 83, 83, and the solvent soaked in the sponge members 83, 83 are evaporated. Material for the sponge members 83, 83 may be hydrophilic to the solvent, namely, substance hydrophilic or absorptive to the solvent, for example, polyvinyl alcohol (PVA). Furthermore, solvent supply sections 84, 84 are provided above the sponge members 83, 83. The solvent supply sections 84, 84 have a plurality of spray nozzles for supplying to the sponge members 83, 83 the solvent in the form of fine droplet or fine mist. For example, flow adjustment section (not shown) is provided for adjusting amount of the solvent to be supplied. Thereby amount of the solvent vapor to be supplied in the gap between the wafer W and the anti-drying boards 6a, 6b is controlled. A barrier (standing wall) may be provided around or along a peripheral edge of the supply perforation 81 to prevent the solvent from dropping down below therethrough not in a form of vapor or steam (or before evaporated or vaporized).

In this configuration, the solvent soaked in the sponge members 83, 83 is evaporated or vaporized and the solvent vapor is supplied in the gap between the wafer W and the anti-drying board 6a through the supply perforations 81. This restrains drying or dehydration of the coating solution on a portion to which the coating solution is applied ahead, and there are provided the same effects as the case described above. Further, in this case, the solvent is evaporated or vaporized by means of the sponge members 83, 83 as buffer material or member, and vaporized ingredient is supplied and diffused in the slight gap between the wafer W and the anti-drying board 6a. Therefore, it is rare that air current of a solvent atmosphere disturbs the surface of the coating solution and lowers evenness or uniformity of the coating solution or film thickness on the surface of the wafer W. In this embodiment, a vertical distance of the gap between the surface of the wafer W and the surfaces of the anti-drying boards 6a, 6b is not limited to maximum 2 mm, and, for example, may be 5.0 mm. However, if the vertical distance of the gap is set maximum 2 mm, drying speed of the coating solution may be controlled more surely.

In the present invention, only one of the anti-drying boards 6a, 6b, namely the anti-drying board 6a, which is disposed on a side where a portion of the wafer W to which the coating solution is applied enters, may be provided, and the anti-drying board 6b may not be provided. Or, the solvent vapor supply means 8 as described above may be provided only on a side of the anti-drying board 6a. And, this invention is applicable not only to application of the coating solution in a manner of so-called drawing with one stroke, but also application of the coating solution in another manner as follows. For example, a coating solution discharge nozzle 4 has a discharge outlet shaped of a slit extending right and leftward for a length at least longer than a region of the wafer W where circuit is formed, and the coating solution is discharged by the coating solution discharge nozzle 4 while scanning or moving the coating solution discharge nozzle 4 in a direction from a front edge to a rear edge of the wafer W or from a front edge to a rear edge of the wafer W. Further, the present invention is applicable to coating a substrate other than the wafer W, for example, a substrate for LCD (liquid crystal display) or a reticle substrate for photomask. In addition, needless to say, the present invention is applicable not only to the coating solution for insulation film, but also other coating solution or chemical having similar level of viscosity.

Figure 10:
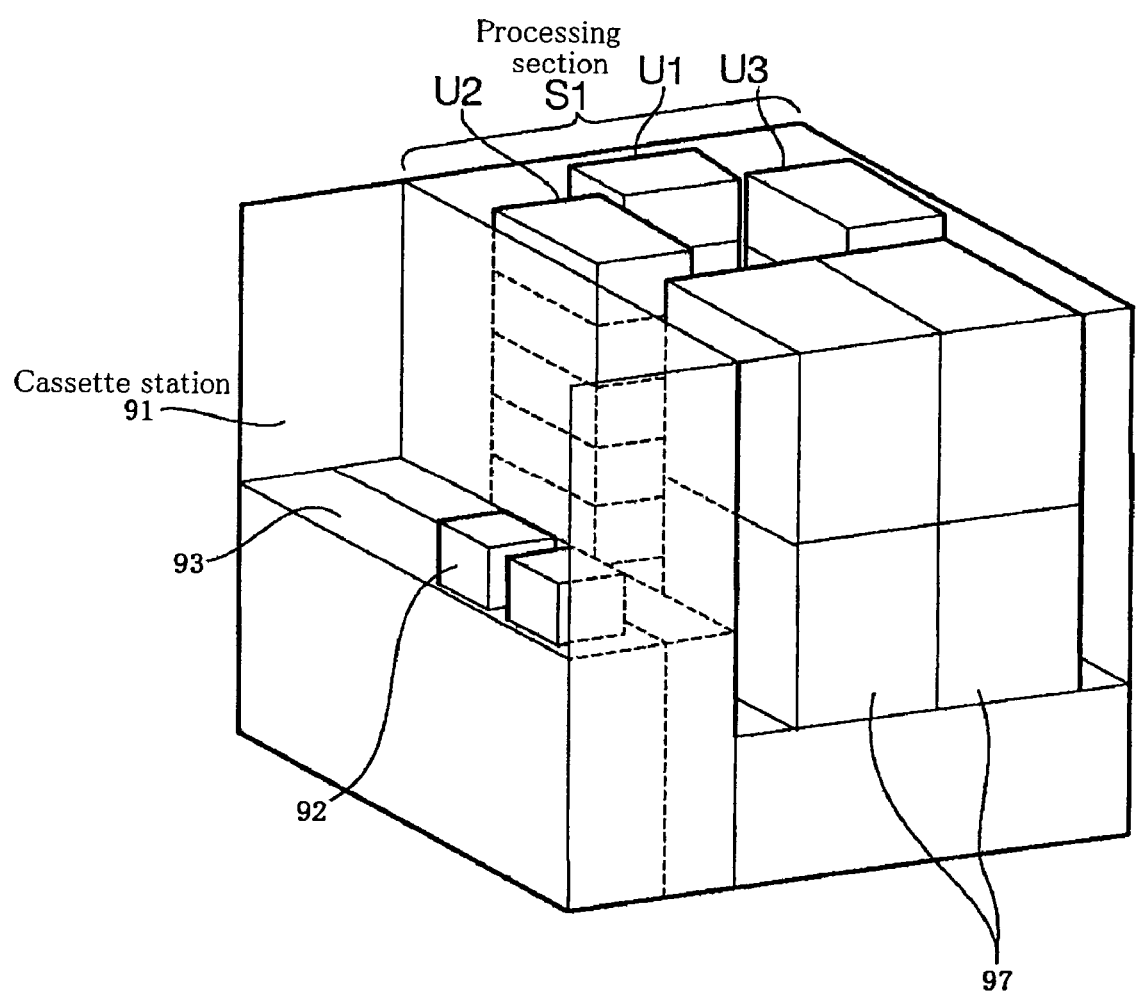
FIG. 10 is a perspective view of the coating film forming system where the film coating unit of the present invention is incorporated.
Figure 11:
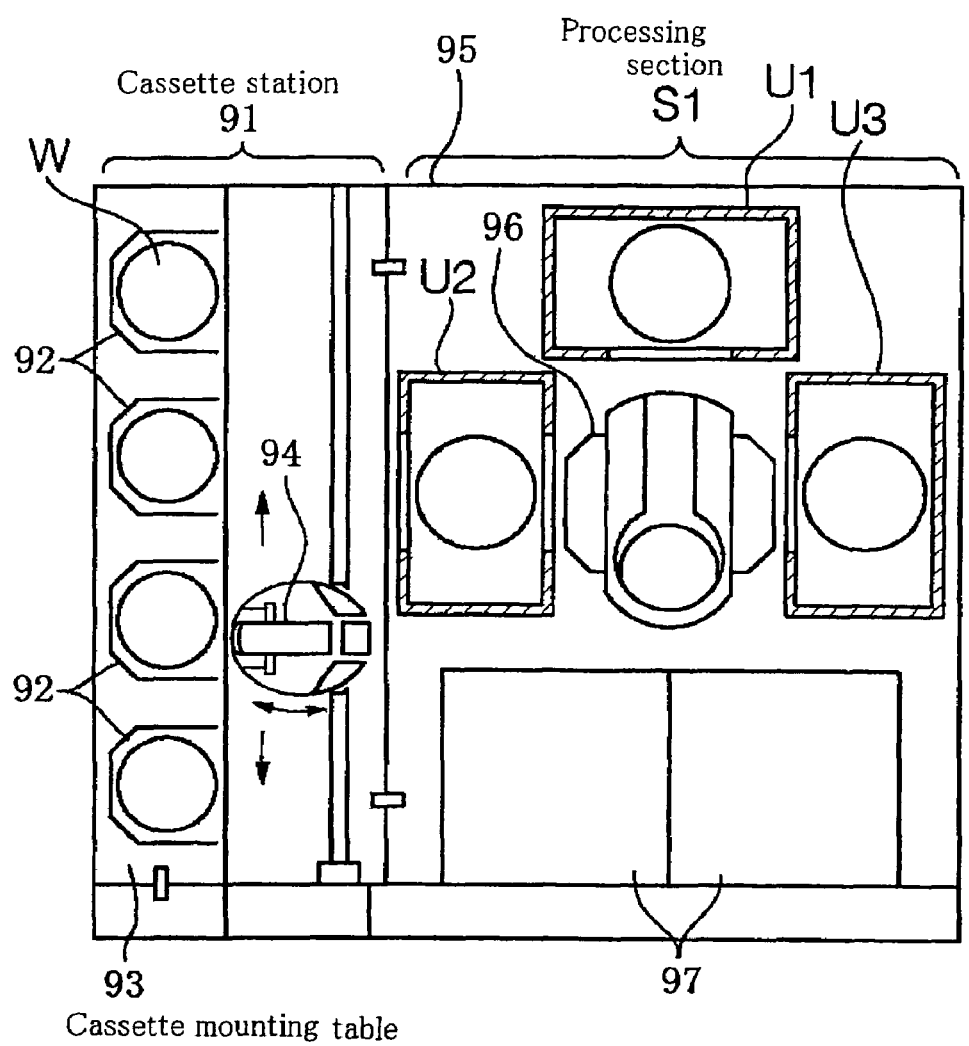
FIG. 11 is a plan view of the coating film forming system where the film coating unit of the present invention is incorporated.

Lastly, one example of a film coating system or coating film forming system where the film coating unit described above is incorporated is described with reference to FIGS. 10 and 11. In FIGS. 10 and 11, reference numeral 91 indicates a cassette station. The cassette station 91 has a cassette mounting portion or table 93 where a cassette 92 containing, for example, 25 pieces of the wafer W is mounted and receiving/forwarding means 94 for delivering and receiving the wafer W with the cassette 92 mounted on the cassette mounting portion 93.

Behind or inside the receiving/forwarding means 94, a processing section S1 is connected. The processing section S1 is surrounded in a housing 95 around a periphery thereof, and is provided with main transfer or delivery means 96 in a center thereof. Referring to FIG. 11, viewed facing the back, a plurality of coating units 97 equipped with the film coating units described above are incorporated, for example, on the right side. And shelf units U1, U2 and U3 which consist of units of heating and cooling systems or baking and cooling systems or the like, stacked up in multi-tiers are disposed on left, front and back sides respectively. The coating units 97 and the shelf units U1, U2 and U3 are arranged so as to surround the main delivery means 96.

The shelf units U1, U2 and U3 are composed of a group of various kind of units for conducting pretreatment and post treatment for the coating unit 97 or the like respectively. The group includes reduced-pressure drying unit for drying under reduced pressure the wafer W where the coating solution is applied to the surface in the coating unit 97, a baking unit for baking the wafer W, a cooling unit for cooling the wafer W and so on. In the shelf unit U3, a delivering and receiving unit is also incorporated. The delivering and receiving unit includes a delivering and receiving table for delivering and receiving the wafer W. The main transfer means 96 is configured, for example, to be movable up and down, back and forth and rotatable about a vertical axis, and the wafer W may be delivered and received to/from the coating unit 97, and each of the shelf units U1, U2 and U3 or each of the component units of the shelf units U1, U2 and U3.

A processing flow of the wafer W in this system is described. First, the cassette 92, which contains wafers W, is mounted on the mounting table 93, from outside. The wafer W is picked up from the cassette 92 by the receiving/forwarding means 94. The wafer W picked-up is forwarded to the main transfer means 96 via a receiving/forwarding unit, which is one of shelves of the heating/cooling unit, the baking/cooling unit or shelf unit U3. The wafer W forwarded is subjected to hydrophobic treatment in a processing section, which is one of the shelves of the unit U3. Thereafter, the coating solution is applied to the wafer W by the coating unit 97. The wafer W is dried under reduced pressure in a reduced-pressure drying unit, heated in the heating unit or baked in the baking unit, and then cooled to a predetermined temperature in the cooling unit. After that, the resultant wafer W is returned to the cassette 92 on the mounting table 93.

EXAMPLES

Next, explained are examples/comparative examples which are conducted to ensure effects of the present invention.

Example 1

In Example 1, a 8-inch sized wafer W is coated or formed with an insulating film on a surface thereof by using the film coating unit stated above as shown in FIGS. 1 and 2. Detailed processing conditions in Example 1 are listed below.

Composition of coating solution; Organic solvent (methyl siloxane polymer)
Viscosity of the coating solution; 5 cp (at 25° C.)
Gap between the wafer W and anti-drying boards 6a, 6b; 2 mm
Coating solution supply flow rate; 1.0 ml/min
Scanning speed of the coating solution discharge nozzle 4; 1000 mm/sec
Intermittently moving speed of the wafer W; 1000 mm/sec

Comparative Example 1

In Comparative Example 1, processing conditions are the same as in Example 1 except that the vertical distance of the gap is set 5 mm.

Comparative Example 2

In Comparative Example 2, processing conditions are the same as in Example 1 except that the anti-drying boards 6a, 6b are not provided.

Comparative Example 3

In Comparative Example 3, processing conditions are the same as in Example 1 except that the anti-drying board 6a is provided in inclined state. The anti-drying board 6a is inclined so as to decrease a vertical distance of the gap from 4 mm to 2 mm in a moving direction of the wafer W.

(Results and Prospects of Example 1 and Comparative Examples 1 to 3)

Figure 12:
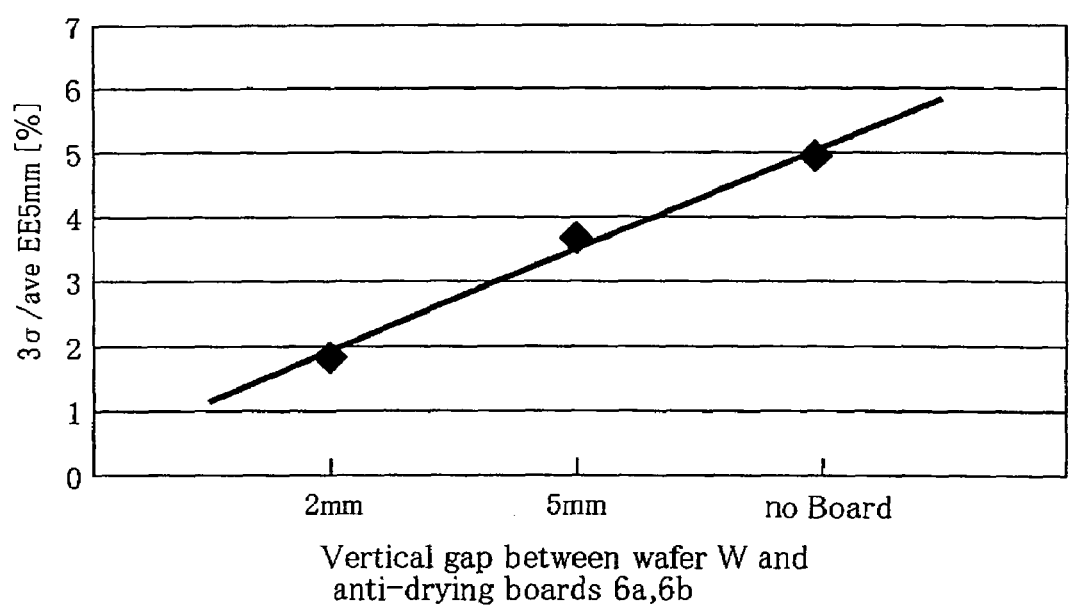
FIG. 12 is a graph of characteristics showing a result of a test implemented on samples to confirm effects of the present invention.
Figure 13:
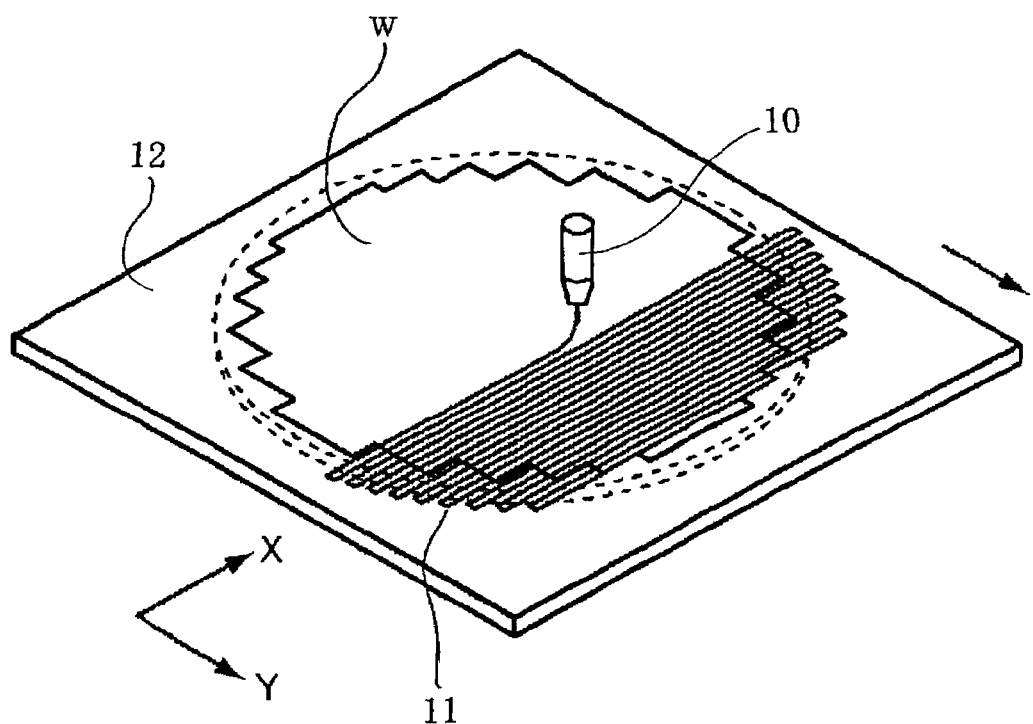
FIG. 13 is an explanatory view of a conventional film coating unit.

In each of Example 1 and Comparative Examples 1 to 3, deviation (3.) of film thickness of insulation film formed on a surface of the wafer W is calculated. The results are shown in FIG. 12. As is apparent from the results, deviation (3.) is restrained maximum 2% in Example 1 where the vertical distance of the gap between the wafer W and the anti-drying boards 6a, 6b is set to 2 mm. On the other hand, deviation (3.) is 3.7% in Comparative Example 1 where the vertical distance is set to 5 mm, and deviation (3.) is 5% in Comparative Example 2 where the anti-drying boards 6a, 6b are not provided. Further, in Comparative Example 3 where the anti-drying board 6a is inclined, although not shown, deviation (3.) is 2.5%. In this case, the coating solution or the film is built up thicker on the front edge side (a side of moving direction) of the wafer W. That is to say, it is confirmed that highly accurate film thickness profile may be achieved by setting

We claim:

1. A film coating unit for forming a coating film on a surface of a substrate, comprising:
    a substrate holder for holding the substrate horizontally,
    a coating solution discharge nozzle for applying coating solution to the surface of the substrate held by the substrate holder in a direction from a front edge toward a rear edge of the substrate,
    a driving section for relatively moving the substrate holder in a forward and backward direction with respect to the coating solution discharge nozzle,
    an anti-drying board opposed to the surface of the substrate in parallel relation thereto, the anti-drying board being disposed so as to cover an entire range of the surface of the substrate to which the coating solution is applied by the coating solution discharge nozzle,
    a height adjustment mechanism for adjusting a relative height of the anti-drying board with respect to the substrate, and
    a microprocessor including a memory for storing data which relates a kind of the coating solution to the relative height of the anti-drying board with respect to the substrate, the microprocessor reading a relative height data corresponding to a kind of a selected coating solution from the memory to output control signals to control the height adjustment mechanism.

2. The film coating unit as set forth in claim 1 wherein viscosity of the coating solution is maximum 5 cp at least when the coating solution is applied to the surface of the substrate.

3. The film coating unit as set forth in claim 1 wherein a peripheral edge portion of the anti-drying board is folded downward on an outer edge of the substrate.

4. The film coating unit as set forth in claim 1 wherein the anti-drying board is opposed to the surface of the substrate in parallel relation thereto, at height of maximum 2 mm from the surface thereof.

5. A film coating unit for forming a coating film on a surface of a substrate, comprising:
   a substrate holder for holding the substrate horizontally,
   a coating solution discharge nozzle for applying coating solution to the surface of the substrate held by the substrate holder in a direction from a front edge toward a rear edge of the substrate,
   a first driving section for relatively moving intermittently the substrate holder with respect to the coating solution discharge nozzle so that the coating solution discharge nozzle relatively moves in a direction from a front edge toward a rear edge of the substrate,
   a second driving section for moving the coating solution discharge nozzle right and leftward so as to apply the coating solution in linear shape on the surface of the substrate,
   an anti-drying board opposed to the surface of the substrate in parallel relation thereto, the anti-drying board being disposed so as to cover an entire range of the surface of the substrate to which the coating solution is applied by the coating solution discharge nozzle,
   the first driving section and the second driving section moving the coating solution discharge nozzle or the coating solution discharge nozzle and the substrate holder so as to form linear coating patterns sequentially in rows toward a rear side of the substrate,
   a height adjustment mechanism for adjusting a relative height of the anti-drying board with respect to the substrate, and
   a microprocessor including a memory for storing data which relates a kind of the coating solution to the relative height of the anti-drying board with respect to the substrate, the microprocessor reading a relative height data corresponding to a kind of a selected coating solution from the memory to output signals to control the height adjustment mechanism.

6. The film coating unit as set forth in claim 5 wherein the anti-drying board is opposed to the surface of the substrate in parallel relationship thereto, at a height of maximum 2 mm from the surface thereof.

7. A film coating unit for forming a coating film on a surface of a substrate, comprising:
   a substrate holder for holding the substrate horizontally,
   a coating solution discharge nozzle for applying coating solution to the surface of the substrate held by the substrate holder, in a direction from a front edge toward a rear edge of the substrate,
   a driving section for relatively moving the substrate holder in a forward and backward direction with respect to the coating solution discharge nozzle,
   an anti-drying board opposed to the surface of the substrate so as to cover an entire range of the surface of the substrate to which the coating solution is applied by the coating solution discharge nozzle, the anti-drying board having a number of supply perforations for providing solvent vapor below the anti-drying board,
   a solvent absorber provided on the anti-drying board, and
   a solvent supply section for supplying the solvent to the solvent absorber.

8. The film coating unit as set forth in claim 7 wherein the solvent absorber is sponge member.

9. The film coating unit as set forth in claim 7 wherein viscosity of the coating solution is maximum 5 cp at least when the coating solution is applied to the surface of the substrate.

10. The film coating unit as set forth in claim 7 wherein a peripheral edge portion of the anti-drying board is folded downward on an outer edge of the substrate.

11. The film coating unit as set forth in claim 7, further comprising:
    a height adjustment mechanism for adjusting a relative height of the anti-drying board with respect to the substrate.

12. The film coating unit as set forth in claim 11, further comprising:
    a microprocessor including a memory for storing data which relates a kind of the coating solution to the relative height of the anti-drying board with respect to the substrate, the microprocessor reading a relative height data corresponding to a kind of a selected coating solution from the memory to output control signals to control the height adjustment mechanism.

13. A film coating unit for forming a coating film on a surface of a substrate, comprising:
    a substrate holder for holding the substrate horizontally,
    a coating solution discharge nozzle for applying coating solution to the surface of the substrate held by the substrate holder in a direction from a front edge toward a rear edge of the substrate,
    a first driving section for relatively moving intermittently the substrate holder with respect to the coating solution discharge nozzle so that the coating solution discharge nozzle relatively moves in a direction from a front edge toward a rear edge of the substrate, and
    a second driving section for moving the coating solution discharge nozzle right and leftward so as to apply the coating solution in linear shape on the surface of the substrate,
    an anti-drying board opposed to the surface of the substrate so as to cover an entire range of the surface of the substrate to which coating solution is applied by the coating solution discharge nozzle, the anti-drying board having a number of supply perforations for providing a solvent vapor below the anti-drying board,
    a solvent absorber provided on the anti-drying board, and
    a solvent supply section for supplying the solvent to the solvent absorber, the first driving section and the second driving section relatively moving the coating solution discharge nozzle or the coating solution discharge nozzle and the substrate holder so as to form linear coating patterns sequentially in rows toward a rear side of the substrate.

* * * * *